United States Patent [19]

Watanabe et al.

[11] Patent Number: 4,459,743

[45] Date of Patent: Jul. 17, 1984

[54] AUTOMATIC MOUNTING APPARATUS FOR CHIP COMPONENTS

[75] Inventors: Yoshitsugu Watanabe, Tanashi; Katsutoshi Koenuma, Higashimurayama, both of Japan

[73] Assignee: J. Osawa Camera Sales Co., Ltd., Tokyo, Japan

[21] Appl. No.: 326,846

[22] Filed: Dec. 3, 1981

[30] Foreign Application Priority Data

Dec. 5, 1980 [JP] Japan ................................. 55-170825
Dec. 5, 1980 [JP] Japan ............................ 55-173762[U]
Dec. 10, 1980 [JP] Japan ............................ 55-176116[U]
Dec. 10, 1980 [JP] Japan ............................ 55-176117[U]
Apr. 30, 1981 [JP] Japan .............................. 55-61576[U]

[51] Int. Cl.³ ............................................. H05K 3/30
[52] U.S. Cl. ...................................... 29/740; 29/759; 29/840
[58] Field of Search ................... 29/740, 759, 840, 741

[56] References Cited

U.S. PATENT DOCUMENTS

| | | | |
|---|---|---|---|
| 4,205,433 | 6/1980 | Araki et al. | 29/741 X |
| 4,234,418 | 11/1980 | Boissicat | 29/741 X |
| 4,250,615 | 2/1981 | Knuth et al. | 29/741 |
| 4,314,402 | 2/1982 | Lemmer | 29/741 X |
| 4,342,090 | 7/1982 | Caccoma et al. | 29/740 |

*Primary Examiner*—Carl E. Hall
*Attorney, Agent, or Firm*—Robert E. Wagner; Ralph R. Rath

[57] ABSTRACT

An automatic mounting apparatus for electrical chip components comprises a parts feeder including a plurality of hoppers with the chip components therein, and a parts applicator including means for picking up the chip component and movable in orthogonal directions in programmed sequence to transport the chip components successively from the parts hopper to a printed circuit board for automatic mounting thereon within a minimum time.

14 Claims, 43 Drawing Figures

FIG. 3
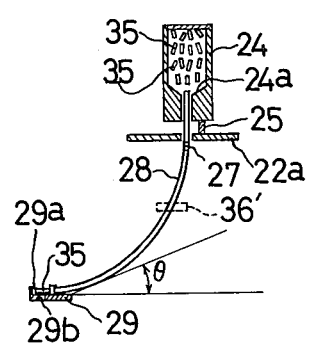
FIG. 4
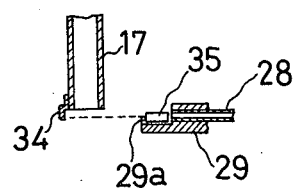
FIG. 5a 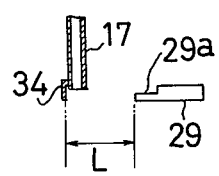  FIG. 5b 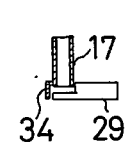  FIG. 5c 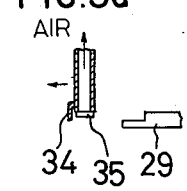  FIG. 5d
FIG. 6
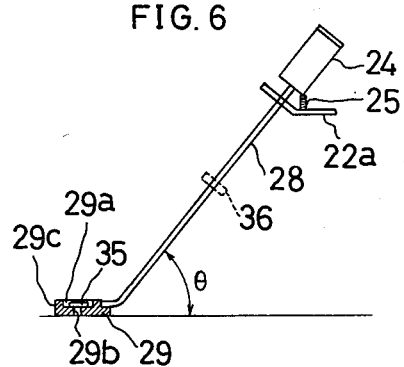

FIG.18a  FIG.18b  FIG.18c
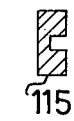 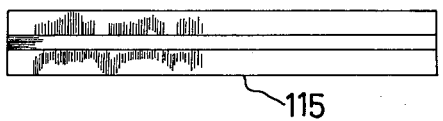 
FIG.19a  FIG.19b  FIG.19c
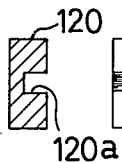 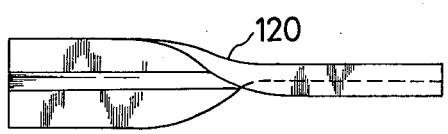 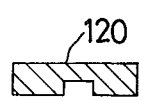
FIG.20a  FIG.20b
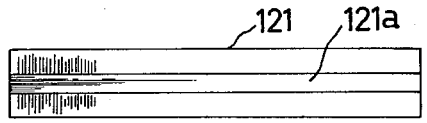 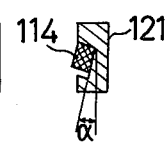
FIG.21a  FIG.21b
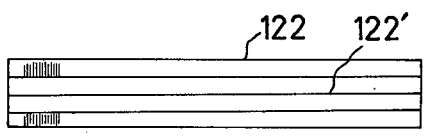 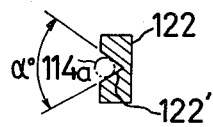
FIG.22a  FIG.22b
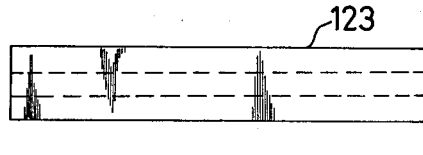 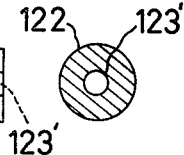

AUTOMATIC MOUNTING APPARATUS FOR CHIP COMPONENTS

DESCRIPTION

1. Technical Field

This invention relates to an automatic mounting apparatus for chip components, and more particularly to an apparatus for automatically mounting chip components such as circular or rectangular resistors or transistors on the printed circuit board.

2. Background Prior Art

Chip components or electrical parts such as resistors or transistors conventionally have their leads inserted into holes of the printed circuit board and soldered for mounting thereon. This method, however, makes difficult the automatic mounting of the chip components on the printed circuit board because the insertion of the leads into the holes is very sophisticated of itself and needs much time.

To overcome this drawback, a portion of the chip component is previously applied with solder and put on that predetermined position on the printed circuit which is also applied with solder. The printed circuit board with the chip components arranged thereon in the predetermined circuit pattern is then introduced to a heating station where the solder is melted to fix the chip components on the printed circuit board at the same time.

In the prior arts, however, there is no automatic mounting apparatus for such circular or rectangular chip components which is capable of automatically feeding and mounting them to the predetermined position on the printed circuit.

SUMMARY OF THE INVENTION

The automatic mounting apparatus according to the present invention comprises a parts feeder including a plurality of parts hoppers with the chip components therein, and a parts applicator with a parts suction bit which is movable in orthogonal directions in programmed sequence to transport the chip components successively from the parts hopper to a printed circuit board for automatic mounting thereon. The suction bit is programmed in movement so that the chip components supplied from the parts hoppers can be mounted to predetermined positions on the circuit board in the minimum time.

In the preferred embodiment of the present invention, the chip components of various kinds are fed from the parts hoppers to parts receivers through guiding means and a rotating carrier having a plurality of arms which are equal in number to the parts receivers and successively reach the chip component supplied by the parts hopper and take them through gates for transportation to the parts receivers to where the suction bit of the parts applicator has access.

This arrangement makes it possible to feed the chip components of different kinds to the mounting station substantially at the same time, thereby reducing the feeding time required to mount the various kinds of parts or chip components on the printed circuit baord.

The parts hopper is constructed to be circular or rectangular and is preferably vibrated to align the chip components in the required direction for improvement in the efficiency of tranportation.

It is therefore an object of the present invention to provide an automatic mounting apparatus being capable of automatically mounting chip components or parts such as resistors or transistors to the predetermined position on the printed circuit board in programmed sequence.

It is therefore another object of the present invention to provide an automatic mounting apparatus for chip components being capable of automatically mounting different kinds of chip components to the predetermined positions of the printed circuit board substantially at the same time.

It is still another object of the present invention to provide an automatic mounting apparatus being capable of automatically mounting a chip component to the predetermined position on the printed circuit board allowing the chip component to be exchanged or supplemented with ease.

BRIEF DESCRIPTION OF SEVERAL VIEWS OF DRAWINGS

Objects in addition to the foregoing will become apparent upon consideration of the following description taken in conjunction with the accompanying drawings wherein:

FIG. 3 is a cross-sectional view showing the parts feeder including the hopper and parts nest;

FIG. 4 is a cross-sectional view showing the parts nest and suction bit;

FIGS. 5a to 5d are cross-sectional sequential views illustrative of sequence in which the chip component is fed and picked up by the suction bit;

FIG. 6 is an illustrative view showing the gate tube optimally inclined to slide down by gravitation;

FIGS. 18 to 24 show various embodiments of the transportation gate tube used to combine the parts hopper and nest;

DETAILED DESCRIPTION

Figure 1:
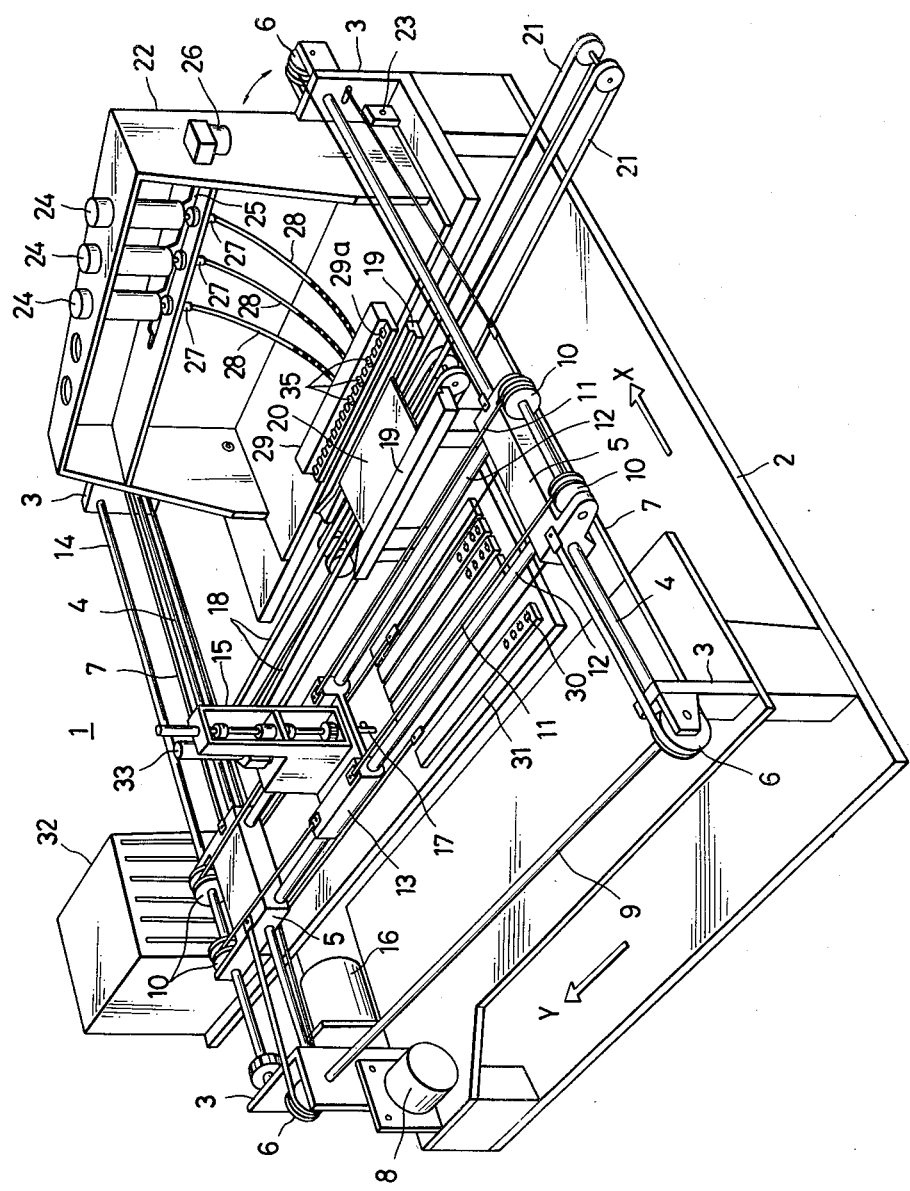
FIG. 1 is a perspective view showing the whole construction of the automatic mounting apparatus according to one embodiment of the present invention.
Figure 2:
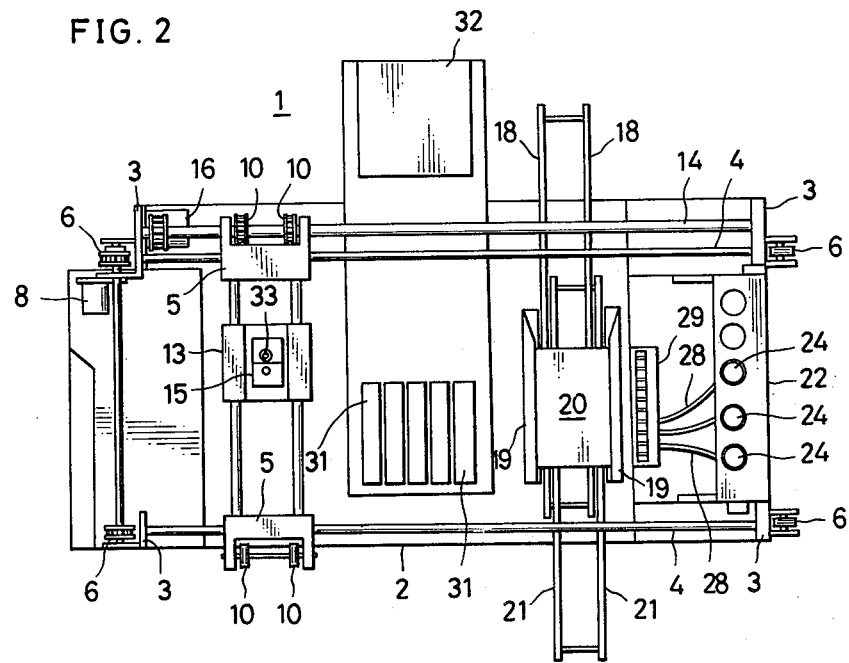
FIG. 2 is a schematic plan view of the automatic mounting apparatus of FIG. 1.

An automatic mounting apparatus according to the present invention is shown in FIGS. 1 and 2 and generally designated by reference numeral 1. The automatic mounting apparatus 1 includes a base platform 2 for carrying two pairs of brackets 3 between which equally spaced guide rods 4 are mounted to guide a pair of X-locaters 5 therealong. A belt 7 is connected at its one end to one end of each X-locaters 5 and turned around pulleys 6 with the other end connected to the other end of the locater 5. A reversible motor 8 serves to drive the pulleys 6 synchronously at the same speed through belts or gear (not shown) and reciprocate the pair of X-locaters 5 along the X-axis.

On the other hand, a pair of belts 11 are mounted perpendicularly to the belts 7 and turned around pulleys 10. The belts 11 are respectively connected at their one end to a Y-locater 13 and at the other end to the other side of the Y-locater 13, which is slidably mounted along a pair of guide rods 12 attached between the X-locaters.

The pulleys 10 are slidably mounted on a rotatable guide rod 14 disposed parallel to the guide rod 4 in spaced relationship, and they have a projection (not shown) which engages with a slot (also not shown) formed along the guide rod 14 for engaged rotation together with the rotation of the guide rod 14. This guide rod 14 can be rotated by a reversible motor 16 through belts or gears (not shown). The driving of the motor 16 causes the guide rod 14 and pulleys 10 to be rotated to move the belts 11 and reciprocate a parts applicator 15 mounted on the Y-locater 13 along the Y-axis.

The motors 8 and 16 are driven in previously programmed sequence with the aid of a microcomputer (not shown) to move the parts applicator 15 to a predetermined position along the X and Y axes so that a suction bit 17 attached to the lower portion of the parts applicator 15 can pick up parts or chip components and mount them on a printed circuit board 20. The parts applicator 15 will be described in detail later.

A pair of belts 18 for transporting the printed circuit board 20 are further provided across the base platform 2 and parallel to the guide rods 12. Mounted on each side of the transporting belts 18 and in the middle of the transporting belts 18 are two facing guide plates 19 between which the printed circuit board 20 is introduced. The belts 18 are terminated at end portions of the guide plates 19 and arranged side by side with another pair of belts 21 for transporting the printed circuit board 20. The alternate driving of the belts 18 and 21 causes the printed circuit board 20 to be transported on the guide plates 19 and removed therefrom to the next step after the chip components have been mounted on the printed circuit board.

Mounted pivotally on the bracket 3 is further a hopper support frame 22, which is shaped in the form of a shelf and turnable about an axis 23 relative to the base platform 2 to the extent that it can be turned from the upright position as shown in FIG. 1 to the outside of the base platform 2 to remove the remaining components from a plurality of cylindrical parts hoppers 24 for exchange purposes.

The parts hoppers 24 come at their lower circumferential edge into contact with a corresponding cam integrally formed on an operation lever 25, which can be reciprocated by an electromagnetic driver 26 fixedly attached on the side of the support frame 22, thereby imparting horizontal and vertical vibrations to the parts hoppers 24. This vibration causes the mixture of the chip components in the parts hoppers and their alignment in the required direction. Each hopper 24 is connected at its lower portion to a gate pipe 27 and gate tube 28. The gate tube 28 is connected at the other end to a parts nest 29 fixedly mounted on the support frame 22 in close proximity to one of the guide plates 19. The parts nest 29 is formed with a plurality of parts receivers 29a arranged in a substantially equally spaced relationship along the guide plates 19. These parts hoppers 24 and parts nest 29 will be described in detail later.

On the other hand, a plurality of magazines 31 for containing chip transistors 30 are automatically transported from an automatic chip transistor feeder 32 to the station facing the parts nest 29.

The parts applicator 15 is further provided at its lower end with a suction bit 17 which is adapted to pick up the parts supplied from the hoppers 24 to the receivers 29a with the aid of negative pressure generated therein. The parts bit 17 is cylindrically shaped at its bottom as shown in FIG. 4 and is provided with a stopper 34 on the side opposite to the parts nest 29. The stopper 34 is an inverted L-shape in cross section and extends downwardly a distance shorter than the width of the chip components 35 supplied to the parts nest 29.

The chip components 35 supplied to the receivers 29a of the parts nest 29 are picked up in the following steps. The parts nest 29 is now in the predetermined position. The parts applicator 15 comes according to the predetermined sequence near to a position as shown in FIG. 5a where it can receive the parts fed. The parts applicator 15 then stops when its suction bit 17 faces the parts receiver 29a of the parts nest 29, and advances horizontally the predetermined distance L until the receiver 29a faces the bottom of the suction bit 17 as shown in FIG. 5b. The chip component 25 is then pneumatically supplied to the receiver 29a of the parts nest 29 through the gate tube 28 and stopped by the stopper 34. If the chip component can be fed by gravitation, it has already been supplied to the receiver 29a in the step as shown in FIG. 5a. At this stage, the negative pressure is introduced to the suction bit 17 to pick up the chip component 35 from the parts nest 29. The suction bit 17 then returns to the original position, as shown in FIG. 5d, and moves onto the predetermined position of the printed circuit board 20 with the negative pressure released therefrom to mount the chip component thereon.

The parts hopper 24 is cylindrically constructed with its bottom 24a shaped conically as shown in FIG. 3. The conical bottom 24a is connected at its center to the gate pipe 27 to which the top of the gate tube 28 is connected. The gate tube 28 is inclined at the optimal angle of θ at which the chip component 35 drops by gravitation to the receiver 29a of the parts nest 29. A parts sensor 36' is mounted in the middle of the tube 28 to detect the parts passing through the gate tube 28 and signal when no parts are supplied therethrough.

Figure 8:
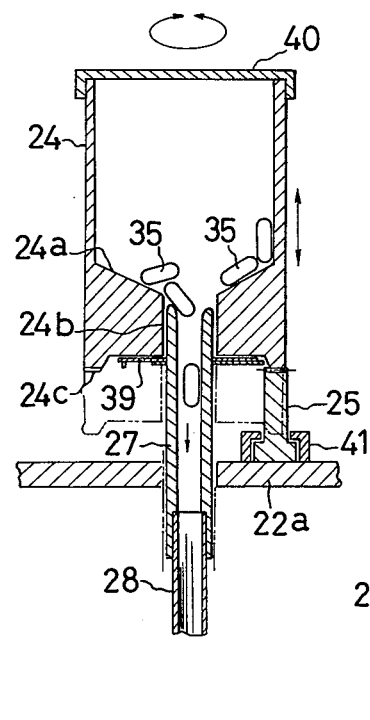
FIG. 8 is a cross-sectional view showing the inner construction of the parts hopper.

The parts hopper 24 is shown in detail on an enlarged scale in FIG. 8. The parts hopper 24 is provided at its tapered bottom 24a with a vertical hole 24b capable of passing the gate pipe 27 which is fixedly connected to a support plate 22a of the support frame 22 and detachably connected at the other end to the gate tube 28. This arrangement allows the parts hopper 24 to be moved vertically for detachment from the fixed gate pipe 27 and support frame 22.

Figure 9:
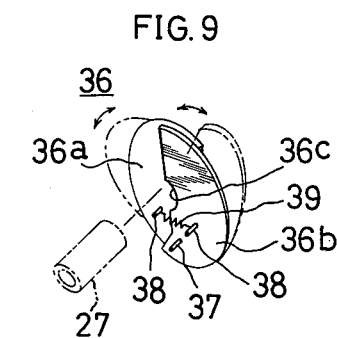
FIG. 9 is a schematic perspective view showing the shutter mechanism attached to the bottom of the parts hopper of FIG. 8.

Mounted on the bottom surface of the hopper 24 is a shutter 36 with a pair of shutter blades 36a and 36b as shown in FIG. 9, which are pivotally mounted about a pin shaft 37. These shutter blades 36a and 36b include pins 38 between which a spring 39 is provided to urge the blades 36a and 36b resiliently in the closing direction and hold the gate pipe 27 through arcuated notches 36c each formed on the inner portion of the shutter blades 36a and 36b. Thus, the shutter blades 36a and 36b can be closed immediately on removal of the parts hopper 24 from the hopper support frame 22 to prevent the parts from being drained out of the parts hopper 24.

Figure 10:
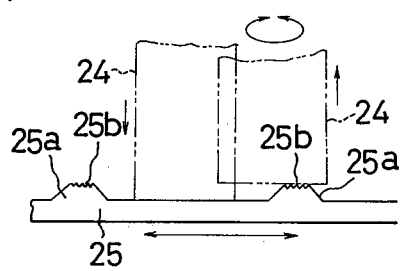
FIG. 10 is an illustrative view showing the vertical movement of the parts hopper in response to the operation lever.

The parts hopper 24 is, on the other hand, covered at its top with a cap 40 and is formed at its lower circumferential edge with a toothed portion 24c for engagement with the operation lever 25 movable along a guide 41 on the support plate 22a to impart vertical and rotational movements to the parts hopper 24. As shown in FIG. 10, the operation lever 25 is formed with trapezoidal cams 25a which are spaced apart a distance greater than the diameter of the parts hopper 24 and formed at its upper portion with a rack 25b engagable with the toothed portion 24c of the parts hopper 24. The reciprocative movement of the operation lever 25 between the distances of the adjacent cams 25a causes the parts hopper 24 to come into a position in which it comes into no contact with the cam 25a and into a position in which the parts hopper 24 rides on the cam 25a for engagement with the rack 25b as shown by imaginary lines in FIG. 10. This imparts the vertical and rotational movements to the parts hopper 24 to align the chip components 35 so that they can drop through the gate pipe 27.

In operation, the magazines 31 with chip transistors 30 thereon are supplied from the automatic feeder 32 to the mounting station, while the chip components 35 are supplied from the parts hopper 24 to the parts nest 29. The printed circuit board 20 is, on the other hand, transported to the predetermined position on the guide frame 19 by means of the transporting belts 18. The position to which the printed circuit board 20 is transported is previously determined and controlled by controlling the motor for driving the belts 18 according to the programs in use.

In this situation, the parts applicator 15 is controlled in movement along the directions X and Y according to the programs in use to pick up the chip transistors 30 and other chip components 35. The sequence of movements of the parts applicator is determined so that all the components can be mounted in the predetermined pattern on the printed circuit board 20 within the shortest time.

The chip components 35 are then successively picked up by the suction bit 17 of the parts applicator 15 as mentioned above and mounted on the printed circuit board 20. The chip transistors 30 are pneumatically picked up by the suction bit 17 in a manner similar to that for the chip components 35.

After the chip components or parts required have been mounted on the printed circuit board 20 in the predetermined sequence, the belts 21 are driven to transport the printed circuit board 20 to the next working station. These steps are sequentially repeated for automatic chip component mounting on the printed circuit board.

FIG. 6 shows another embodiment of the stopper mechanism in which a stopper 29c is formed at the edge of receiver 29a on the parts nest 29 instead of being formed on the side of the suction bit 17. Also in this embodiment, the gate tube 28 is similarly inclined at a suitable angle so that the chip components 35 may slide down through the gate pipe 27 by gravitation until they hit against the stopper 29c of the parts nest 29. Thus, the chip components 35 can previously be supplied to the predetermined position.

The angle θ of inclination of the gate tube 28 is selected depending upon the material of the gate tube or the surface condition of the chip components 35 so that the chip components 35 slide down in the smoothest manner.

It is to be noted that the lowermost chip component is always forced out of the gate tube 28 by gravitation because the chip components are always fed without any interruption and the gate tube 28 is filled with the various chip components coming into contact with each other and pushing the lower components.

Figure 7A:
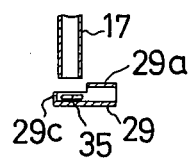
FIGS. 7a to 7c are cross-sectional sequential views illustrative of the feeding and picking up sequences of another embodiment of the suction bit and parts nest.
Figure 7B:
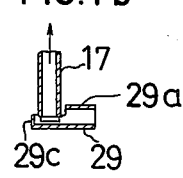
Figure 7C:
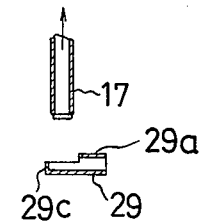

FIGS. 7a to 7c show the sequence of operations in the case where the parts hopper as shown in FIG. 6 is utilized. The suction bit 17 with no stopper stops at the predetermined position above the parts nest 29 as shown in FIG. 7a, and goes down toward the chip component 35 which has already been supplied to the receiver 29a of the parts nest 29 as shown in FIG. 7b. The suction bit 17 is supplied with negative pressure for picking up the chip component 35 as shown in FIG. 7c, and departs from the parts nest 29 after it picks up the chip component 35. At the predetermined position, the negative pressure is relieved from the suction bit in order to mount the chip component on the printed circuit board.

It is of course that the parts nest 29 can be moved vertically and horizontally at the time of suction instead of moving the suction bit 17.

Figure 11:
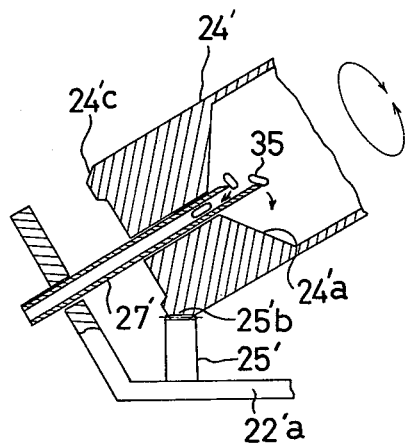
FIG. 11 is a cross-sectional view showing another embodiment of the parts hopper which is disposed in an inclined manner.

FIG. 11 shows another mechanism for imparting vertical and horizontal movements as shown in FIG. 8 to the parts hopper 24. In this embodiment there is shown an inclined parts hopper 24' which is formed at its total circumferential edge with the toothed portion 24'c engagable with a rack 25'b on an operation lever 25' mounted on a support frame 22'a for imparting the horizontal and vertical movements to the parts hopper 24' when the lever 25' is reciprocated. A gate pipe 27' is also inclined and tapered at its top in an off-set manner so that the components 35 may be easily guided into the gate pipe 27'.

Figure 12:
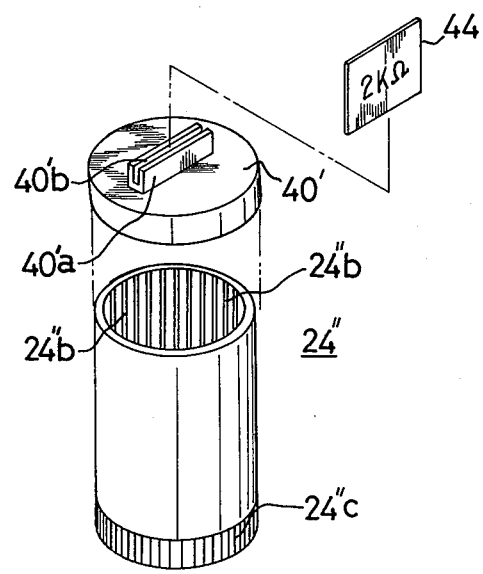
FIG. 12 is a perspective view showing a further embodiment of the parts hopper provided therein with slits for absorbing and collecting dust.

FIG. 12 shows another embodiment of a parts hopper 24" which is formed at its inner side with a plurality of equally spaced slits 24"b for abosrbing and collecting dusts or unwanted particles adhering to the chip components and also formed at its outer lower circumferential portion with a toothed portion 24"c engagable with the rack for imparting rotational movement to the parts hopper 24".

The parts hopper 24" is covered with a detachable cap 40' with a holder 40'a for receiving in a slot 40'b an identification card 44 carrying the designation of the chip components to be accommodated in the parts hopper 24".

Figure 13:
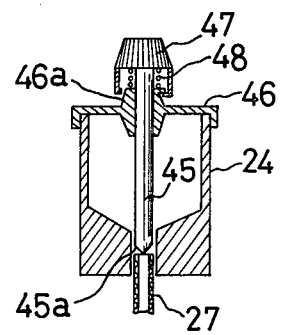
FIG. 13 is a cross-sectional view showing still another embodiment of the parts hopper.

FIG. 13 shows another embodiment of a cap 46 screwed to the parts hopper 24, which is provided with a boss 46a with a center hole through which a shaft 45 is slidably mounted with its bottom 45a tapered so as to be accessible into the gate pipe 27.

The shaft 45 is further provided at its top with a grip 47 which is resiliently urged upwardly by a spring 48 mounted between the boss 46a and grip 47. The grip 47 can be hooked with the boss 46a of the cap 46 to lock the cap 46 to the parts hopper 24 when the grip 47 is pushed against the force of spring 48. In this state, the tapered portion 45a of the shaft 45 closes the entrance of the gate pipe 27 to prevent the chip components from draining into the gate pipe 27.

In these embodiments as shown in FIGS. 12 and 13, the parts hopper is shaped cylindrically and formed at its inner surface with the plurality of axially extending slits which can serve to align the cylindrical chip components with each other in the parts hopper when it receives vertical and rotational movements. The slits also serve to collect the unwanted particles and dusts therein and feed clean chip components.

Figure 14:
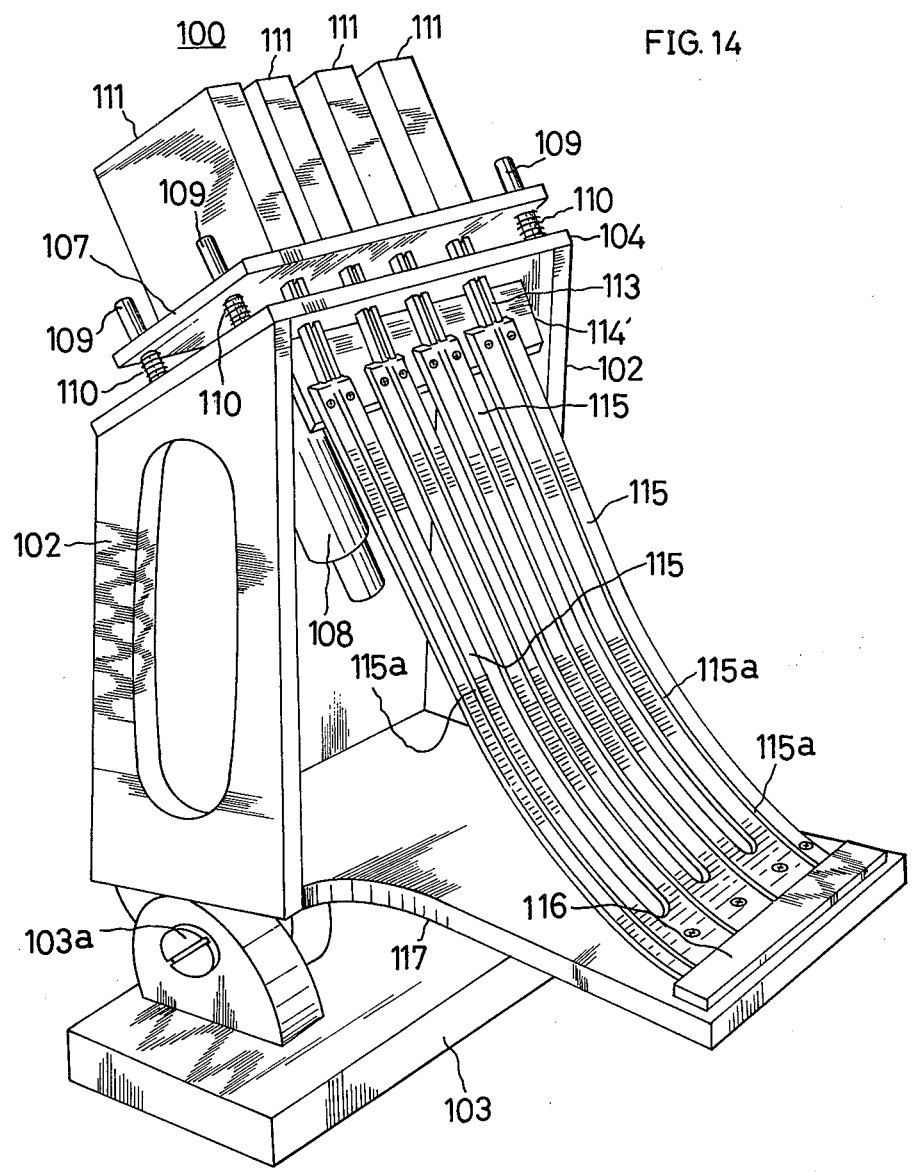
FIG. 14 is a perspective view showing another embodiment of the parts feeder adapted for use to feed the rectangular chip components.
Figure 15:
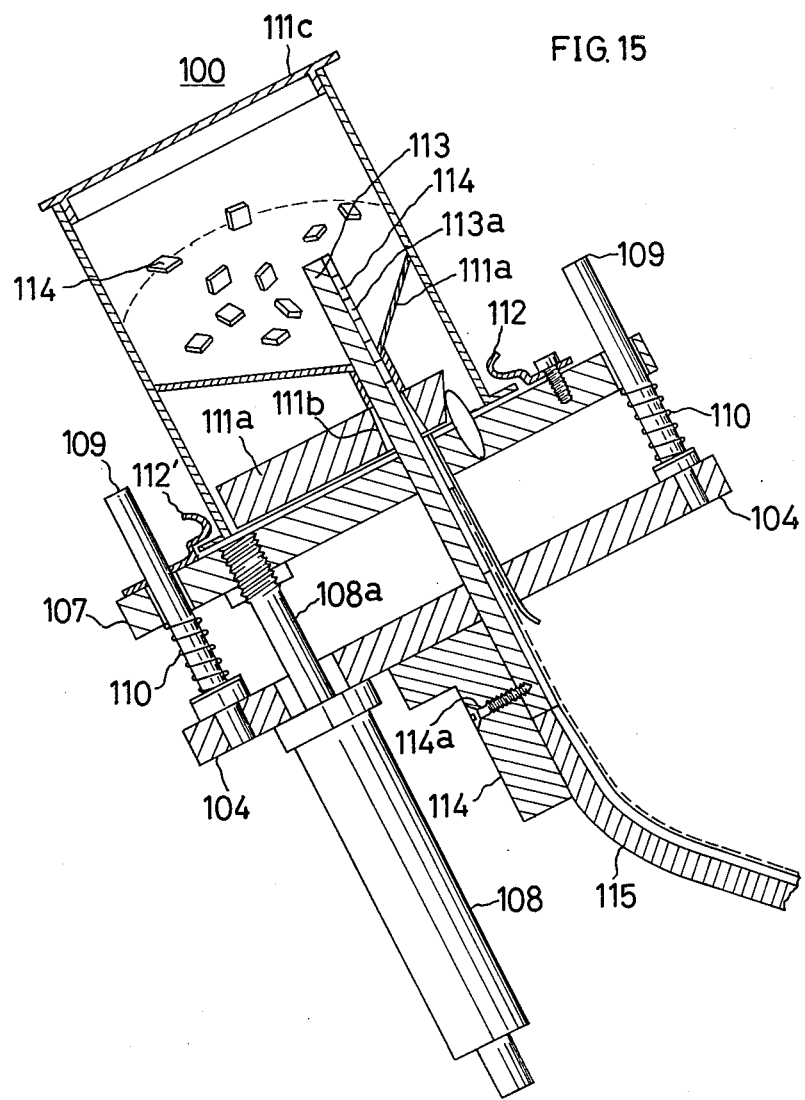
FIG. 15 is a cross-sectional view showing the inner construction of the parts hopper of FIG. 14.

FIGS. 14 and 15 show other embodiments of the parts feeder adapted for use to supply rectangular chip components such as transistors or other electronic elements. A parts feeder 100 includes a pair of support frames 102 which are mounted on a base 103 so as to be pivotal about axes 103a. Mounted on the support frames 102 is an inclined support plate 104 carrying four guide rods 109 which are mounted on the support plate 104 and pass through holes formed on a movable plate 107. The movable plate 107 is fixedly mounted on a rod 108a which is resiliently urged by a spring 110 and is movable within an air cylinder 108 disposed under the support plate 104. The movable plate 107 is guided up or down along the guide rods 109 in response to the actuation of the air cylinder 108.

A plurality of rectangular hoppers are mounted on the movable plate 107 and each of them is provided at its lower portion with a tapered surface 111a with its bottom bored to receive a rectangular gate pipe 113. The rectangular gate pipe 113 is formed therein with a groove 113a for guiding the rectangular electronic components and is mounted by a screw 114a to a bracket 114' fixedly attached to the support plate 104. The parts hopper 111 is covered with a cap 111c detachable to receive therein the chip components 114 to be fed.

Figure 16:
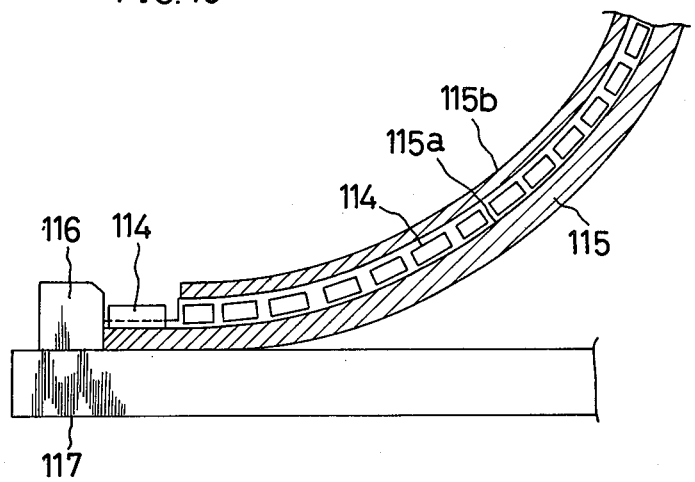
FIG. 16 is a partial side view showing the gate pipe of the part feeder of FIG. 15.

The gate pipe 113 is connected at its lower end to a guide rail 115 extending downwardly in an inclined manner to a stopper 116 as shown in FIG. 14. The stopper 116 is mounted on a base plate 117 fixedly attached to the support frame 102 as shown in FIGS. 14 and 16, serving to stop the components 114 dropping down along a groove 115a of the guide rail 115. Mounted to the upper surface of the guide rail 115 is a transparent protective plate 115b through which the operator can observe from the outside how smoothly the chip components slide down.

In operation, the parts hoppers each containing one of the different types of chip components such as capacitors or resistors are mounted on the movable plate 107 with the aid of spring 112, 112' with the gate pipe 113 inserted into the bore 111b until it extends into a portion of the parts hopper 111. In this embodiment, a shutter mechanism is also provided to close the bore 111b when the parts hopper is removed from the gate pipe 113.

In this state, the air cylinder 108 is driven at predetermined intervals controlled by a controller (not shown) to vibrate the movable plate 107 up and down with a stroke which corresponds with the movement of the rod 108a of the air cylinder 108 in order to impart the vibration to the chip components within the parts hopper 111 with the result that they are moved and aligned in the required direction with each other.

Thus, the chip components 114 are successively introduced to the guide rail 115 through the gate pipe 113 and are fed into the groove 115a of the guide rail 115 in alignment with each other with the lowermost chip component always being transported to the bottom and stopped by the stopper 116. Thus, the lowermost component is always ready to be picked up by the parts applicator, and the following component is transported to the stopper after the lowermost chip component is picked up by the suction bit.

In this embodiment, the parts feeder is constructed to be turnable about the axis 103, so that the feeder can be turned as a whole in response to the turning of the support frame 102 together with the stopper 116 to the extent that the chip components remaining in the guide rail 115 and gate pipe 113 can be collected back into the parts hopper 111. In this state, the parts hopper is replaced by another hopper with the different chip components therein, or the cap 111c is removed from the parts hopper 111 to exchange the remaining chip components with different ones.

Figure 17:
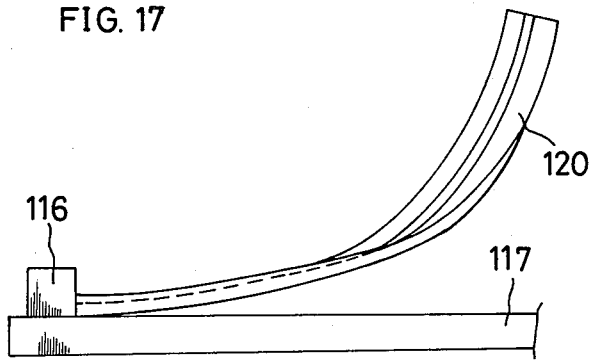
FIG. 17 is a partial side view showing another embodiment of the gate pipe distorted at a certain angle between the parts nest and hopper.

FIG. 17 shows another guide rail, which is distorted between the gate pipe 113 and stopper 116 at a predetermined angle, for example, 90 degrees. The use of this 90° destorted guide rail makes it possible to change the orientation of the sliding chip components by 90°. FIGS. 18a to 18c show the non-distorted guide rail used for the embodiment of FIGS. 14 to 16, while FIGS. 19a to 19c show the distorted guide rail.

As shown in FIG. 20a, a groove 121a in a guide rail 121 may be tapered at angle of α to bring the chip components against one of the side walls to improve the chip component transportation. A V-shaped groove 122' may further be provided on a guide rail 122 to bring circular components 114a into the center of the groove as shown in FIGS. 21a and 21b. However, the circular chip components may preferably be transported by a gate 123 and guide rail provided with a transportation hole 123' which is greater than the diameter of the chip components as shown in FIGS. 22a and 22b.

Figure 23:
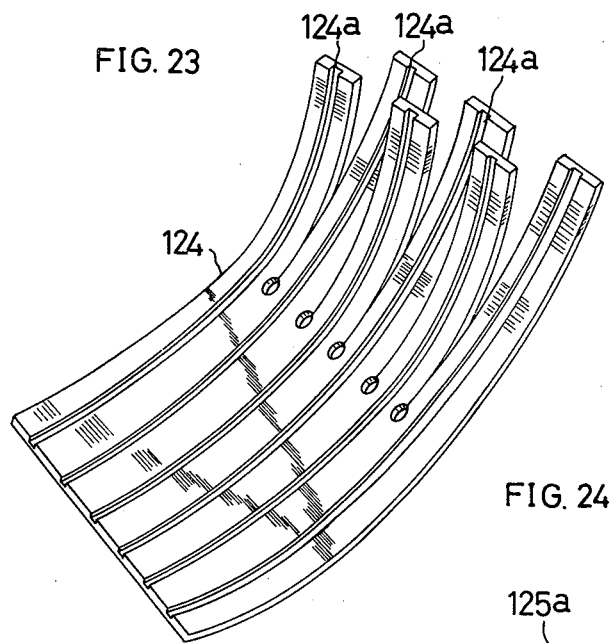

FIG. 23 shows another embodiment of the guide rail 124 made of one plate with its one end cut into parallel guide elements which are alternately staggered to form a plurality of such guide elements having guide grooves 124a. This allows for the arrangement of a plurality of hoppers in two off-set lines for improvement in the efficiency of parts feeding.

Figure 24:
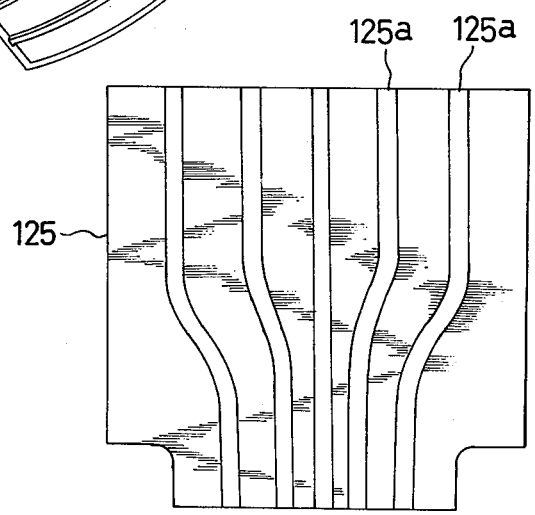

The guide rail 125 may, as shown in FIG. 24, be made wider on the side of the gate pipe and narrower on the side of the stopper to collect the chip components into a limited place with efficiency.

Another embodiment of the guide rail may be such that the guide rail are distorted by a certain angle as shown in the right portion of FIG. 19 and shaped in the curved manner in the left portion.

As mentioned above, the parts feeder according to the above mentioned embodiment includes a plurality of parts hoppers which are vibrated to transport the chip components through the guide rail to the predetermined position one by one, so that the parts or chip components can be fed to the predetermined position with their direction aligned with each other. The guide member can be changed in configuration to guide the circular or rectangular parts with efficiency. The parts feeder can further advantageously be turned to collect all the parts out of the hoppers at once for exchange purposes.

Figure 25:
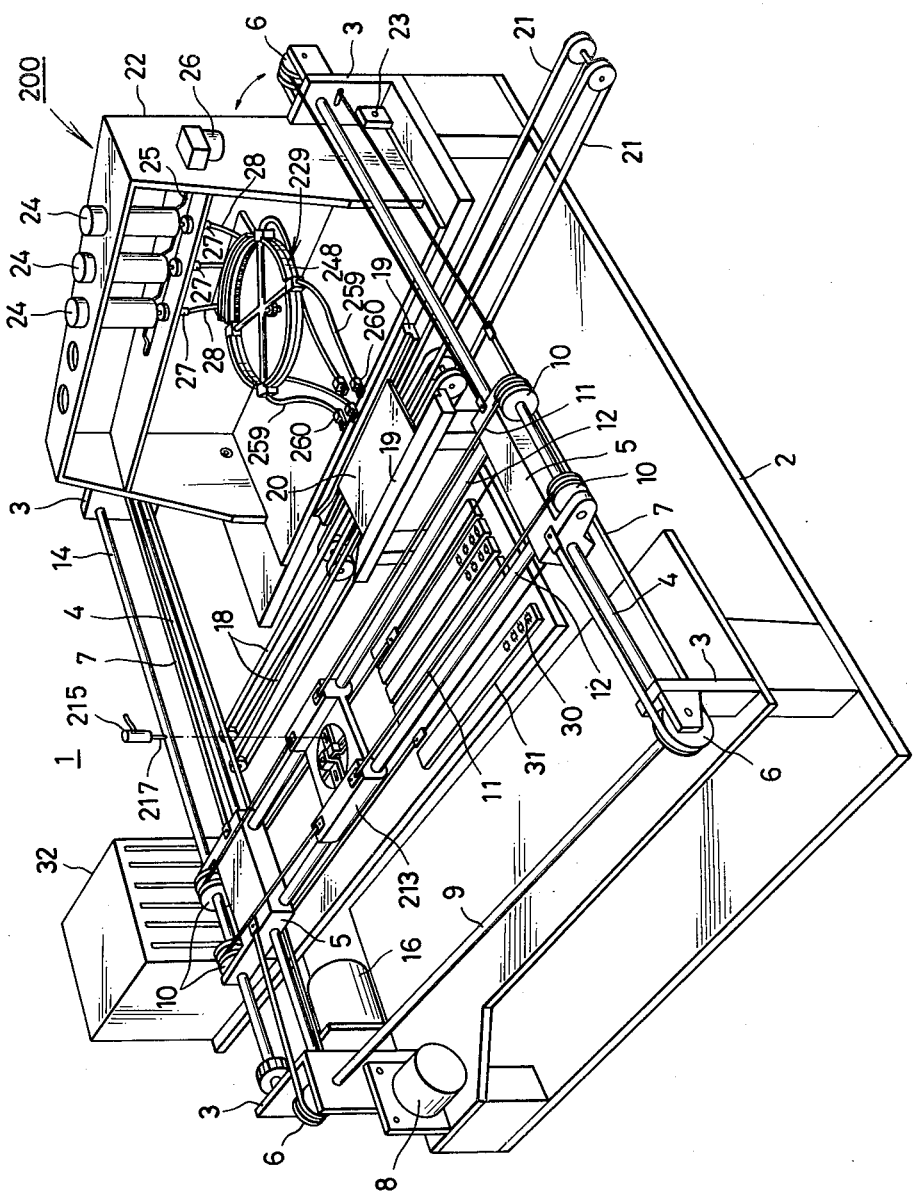
FIG. 25 is a perspective view showing another embodiment of the automatic mounting apparatus according to the present invention.

In FIG. 25 there is shown another embodiment of an automatic mounting apparatus adapted for use with a parts feeder 200 for simultaneously supplying to different positions different kinds of chip components, which are respectively picked up by suction bits 215 of a parts locater 213 and transported to the printed circuit board 20 for automatic mounting thereon.

Figure 26:
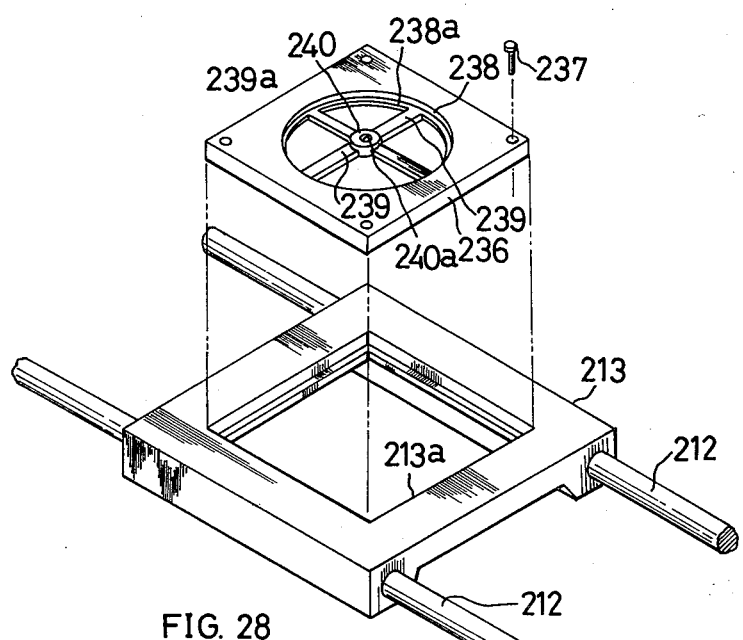
FIGS. 26 and 27 are perspective disassembled views each shwoing the parts locater used in the apparatus of FIG. 25.
Figure 28:
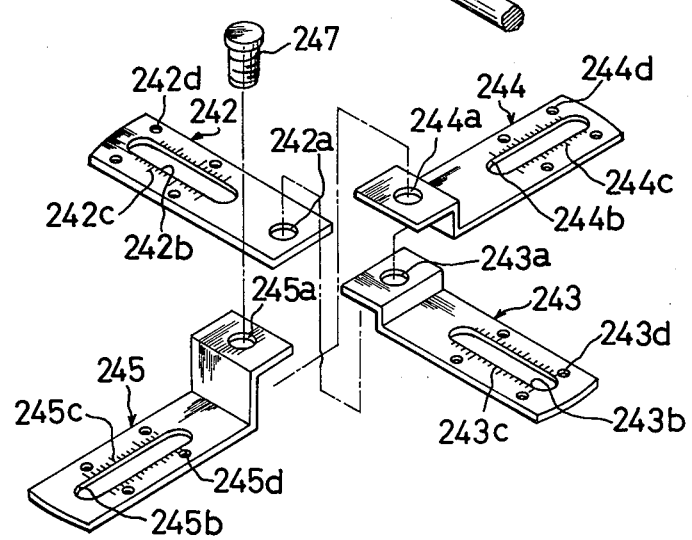
FIG. 28 is a perspective disassembled view showing the adapters used in the parts locater of FIGS. 26 and 27.
Figure 27:
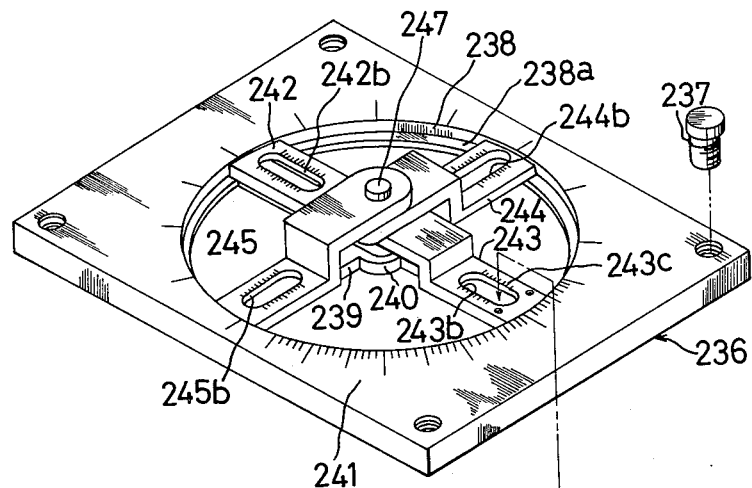

The parts locater 213, as shown in FIGS. 26 to 28, includes a base plate 236, which is fixedly attached to the opening 213a formed on the locater 213 by screws 237. The base plate 236 is formed at its central portion with a circular opening 238 of relatively greater diameter having a staggered portion 238a from which crossing ribs 239 extend horizontally. The ribs 239 intersect with each other at the center of the parts locater at which a boss 240 with a screwed hole 240a is located.

A scale (not shown) is formed at the inner circumferential edge of the opening 238 for positioning adapters relative to the base plate 236.

The parts locater further includes four adapters 242 to 245. The first adapter 242 is made flat as shown in FIG. 28 and formed at its one end with a hole 242a and at the other end with an elongated slot 242b having a positioning scale 242c thereon and holes 242d for receiving screws for fixing a plate 246 of the parts applicator.

The second to fourth adapters 243 to 245 are, on the other hand, bent at their one end having holes 243a, 244a and 245a, but constructed to have the same distance between their holes and slots as that of the first applicator. The second to fourth adapters 243 to 245 are further so constructed that the surfaces on which the slots 242b to 245b are formed are in substantially the same plane when they are overlapped.

The end portions of the adapters 242 to 245 on which the slots 242b to 245b are formed are arcuated with their curvatures substantially equal to that of the circular opening 238 of the base plate 236.

With this arrangement, the adapters 242 to 245 are stacked in such a manner that the holes 242a to 245a are aligned with each other with the first adapter 242 disposed at the lowermost position. Each of the adapters 242 to 245 is then distributed radially at equally spaced intervals in alignment with the corresponding rib 239 and screwed to the boss 240 of the base plate 236 by means of the screw 247.

The parts applicator 215 is, on the other hand, fixed to the plate 246 with its suction bit 217 brought into engagement with the corresponding adapter as shown in FIG. 27. The plate 246 is slidable together with the suction bit 217 along the slot 243b of the adapter 243 according to the scale 243c formed thereon for alignment with a corresponding parts receiver to be described, and can be fixed to the adapter 243 by screws after the alignment therewith. In FIGS. 25 and 27, only one applicator is shown, but applicators are usually used whose number corresponds to the number of the adapters 242 to 245 and the parts receiver to be used.

Figure 29:
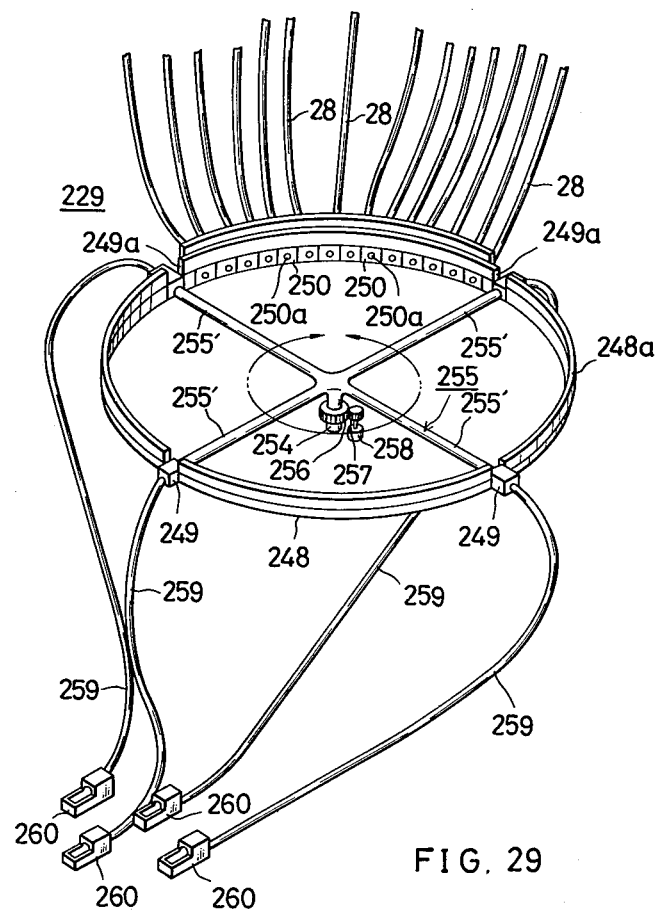
FIG. 29 is a perspective view showing the circular parts nest used in the embodiment of the automatic moutning apparatus in FIG. 25.

A parts nest 229 in this embodiment is constructed to be circular as shown in FIG. 29, including a ring frame 248 with an annular wall 248a thereon. The annular wall 248a is formed with notches 249a which are disposed in an angularly equally spaced relationship to receive parts blocks 249.

Figure 30:
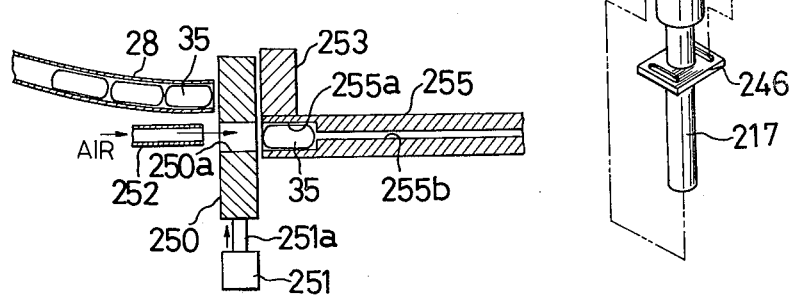
FIG. 30 is a cross-sectional view showing the arrangement of the gate tube and carrier.
Figure 31:
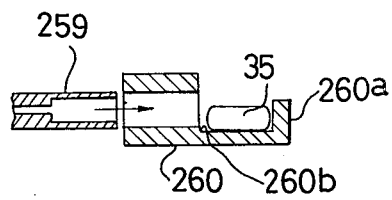
FIG. 31 is a cross-sectional view showing the gate tube and parts receiver on which the chip component is fed.

A portion of the wall 248a is formed as a plurality of gates 250 movable vertically. The gate 250, as shown in FIG. 30, is relatively thick in cross-section, having a center hole 250a greater than the chip components 35 so as to be passable therethrough. The gate 250 is connected at its bottom to a plunger 251a of a solenoid 251 with its center hole 250a usually facing a carrier 255 to be described later. The solenoid 251 is actuated to raise the plunger 251a and the gate 250 until the center hole 250a faces the gate tube 28.

An air nozzle 252 is further provided on the side of the gate 250 opposite to the carrier 255 in alignment therewith, and a stopper 253 is disposed on the carrier 255 in a position opposite to the gate tube 28 so as to stop the chip components sliding down.

As shown in FIG. 29, on the other hand, a pipe 254 is rotatably mounted in the central portion of the ring frame 248 and is connected at its lower portion to an air supply source (not shown) and at its upper portion integrally to the carrier 255 with four arms 255' each of which extends horizontally in a crossing manner. The carrier 255, as shown in FIG. 30, includes a space 255a communicating with an air passage 255b bored in the carrier 255.

Mounted to the pipe 254 is a gear 256 which is driven through a pinion 257 by a stepping motor 258, which rotates in both directions according to the predetermined programmed sequence to turn the carrier 255 against the gates 250 for parts receiving therefrom and then to the parts blocks 249 for draining thereinto.

A plurality of guide tubes 259 are introduced from the parts blocks 249 to parts receivers 260, each of which includes a space 260b for receiving the chip component 35 from the gate tube 259 and a stopper 260a for limiting the further movement of the chip component.

In such an arrangement, the motors 8 and 16 are driven to move the parts applicator 215 in the directions X and Y towards the parts receivers 260, which are respectively located in alignment with the suction bits 217 of the parts applicators 215 when the parts locater 213 reaches them to obtain the chip components to be mounted.

A control signal is then applied to drive the solenoid 251 and raise the plunger 251a upwardly, thereby pushing the gate 250 from the position as shown in FIG. 30 to a position where the hole 250a faces the gate tube 28. As a result, the lowermost chip component 35 in the gate tube 28 enters the hole 250a and stops therein against the stopper 253. The solenoid 251 is then deenergized to bring the gate 251 down until the hole 250a becomes opposite to the carrier 255 which is moved thereto by the stepping motor 258 to catch the chip component 35 to be received. In this state, the air is supplied to the nozzle 252 to feed the chip component 35 into the space 255a of the carrier 255. The negative pressure is then introduced to the passage 255b of the carrier 255 to suck the chip component 35 into the space 255a for transportation, and the carrier 255 is rotated to bring it into the corresponding parts block 249 as shown in FIG. 29. At this time, positive pressure is applied in the passage 255b to release the chip component and transport it to the space 260b of the parts receiver 260 through the gate tube 259 in preparation for suction by means of the corresponding suction bit.

Thus, the specific chip component 35 is fed to each of the parts receivers 260, and the parts locater 213 is moved thereto to suck the chip component by means of the suction bit 217 of the corresponding parts applicator 215 to which the negative pressure is applied. After the suction of the chip component 35, the suction bit 217 is raised and moved above the printed circuit board 20 for mounting thereon.

In this embodiment, a plurality of chip components of different kinds are advantageously fed by means of the rotating carriers substantially at the same time, thereby reducing the feeding time required to mount the various kinds of parts or components on the printed circuit board.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention should not be limited to the particular embodiment disclosed as the best mode contemplated for carrying out the invention, but that the invention will include all embodiments falling within the scope of the appended claims.

We claim:

1. An automatic mounting apparatus for mounting chip components on a printed circuit board, comprising a parts feeder including a plurality of exchangable parts hoppers which contain therein said chip components, a parts nest having a plurality of parts receivers connected through guide means to said hoppers for storing said chip components fed from said parts feeder in preparation for picking-up, a parts applicator including means for picking up said chip component and movable in orthogonal directions toward said parts receivers in programmed sequence, and means for transporting said printed circuit board to a position in proximity of said parts nest, said parts applicator being controlled in movement so that the chip components picked up from said parts receiver are moved to a predetermined position on said printed circuit board, and a common support frame for said parts feeder and said parts nest turnable about an axis from upright to fallen positions to remove the remaining chip components in said parts hoppers.

2. An automatic mounting apparatus according to claim 1, wherein said parts hoppers and guide means are inclined at an angle suitable for sliding said chip components down by gravitation.

3. An automatic mounting apparatus according to claim 1, further including means for vibrating said parts hoppers to mix said chip components in said parts hopper for alignment in direction with each other.

4. An automatic mounting apparatus according to claim 3, wherein each parts hopper has a circumferential edge with a toothed portion on said edge and a rack engaging said toothed portion, which reciprocable to impart the vertical and/or rotational movements to said parts hopper.

5. An automatic mounting apparatus according to claim 1, wherein said parts hoppers are shaped cylindrically with the bottom tapered conically and bored to receive said guide means.

6. An automatic mounting apparatus according to claim 5, wherein said parts hoppers are formed on an inner surface with a plurality of grooves for absorbing and collecting dusts and unwanted particles adhering to said chip components.

7. An automatic mounting apparatus according to claim 5, wherein said hopper is covered with a detachable cap carrying a holder for an identification card for designating the name of said chip components in said parts hopper.

8. An automatic mounting apparatus according to claim 5, wherein each parts hopper is provided at its bottom with a shutter which can close said parts hopper when said parts hopper is removed from said guide means.

9. An automatic mouting apparatus according to claim 7, wherein said cap is provided with a downwardly extending shaft which closes the entrance of said guide means.

10. An automatic mounting apparatus according to claim 1, wherein said guide means is a guide tube distorted at a certain angle between said part hopper and parts receiver.

11. An automatic mounting apparatus according to claim 10, wherein said guide tube is formed with a groove whose configuration is adapted to that of said chip component to be guided.

12. An automatic mounting apparatus according to claim 1, wherein said guide means is provided with a plurality of guide grooves spaced wider adjacent said parts hoppers and narrower adjacent said parts receiver.

13. An automatic mounting apparatus according to claim 1, wherein said guide means is made of one sheet of plate cut at its one end into a parallel guide elements which are staggered adjacent said parts hopper.

14. An automatic mounting apparatus according to claim 1, wherein said parts feeder includes a rotatable carrier having a plurality of arms equal in number to said parts receivers, and a plurality of gates each connected through said guide means to the corresponding one of said parts hopper, the arms of said carrier being rotated to reach one of said gates and take the chip component fed from the corresponding parts hopper for transportation to one of said parts receivers.

* * * * *